US012804952B2

(12) United States Patent
Raissi

(10) Patent No.: US 12,804,952 B2
(45) Date of Patent: Nov. 17, 2026

(54) NORMALLY-OFF MESFET DEVICE WITH STACKED GATE CONTACT

(71) Applicant: III-V Technologies GmbH, Vienna (AT)

(72) Inventor: Farshid Raissi, Vienna (AT)

(73) Assignee: III-V Technologies GmbH, Vienna (AT)

( * ) Notice: Subject to any disclaimer, the term of this patent is extended or adjusted under 35 U.S.C. 154(b) by 711 days.

(21) Appl. No.: 18/245,838

(22) PCT Filed: Sep. 13, 2021

(86) PCT No.: PCT/EP2021/075056
§ 371 (c)(1),
(2) Date: Mar. 17, 2023

(87) PCT Pub. No.: WO2022/058269
PCT Pub. Date: Mar. 24, 2022

(65) Prior Publication Data

US 2024/0038869 A1 Feb. 1, 2024

(30) Foreign Application Priority Data

Sep. 18, 2020 (EP) .................................... 20196866
Sep. 18, 2020 (EP) .................................... 20196868

(51) Int. Cl.
*H10D 30/67* (2025.01)
*H10D 30/01* (2025.01)
(Continued)

(52) U.S. Cl.
CPC ......... *H10D 30/675* (2025.01); *H10D 30/015* (2025.01); *H10D 30/475* (2025.01);
(Continued)

(58) Field of Classification Search
CPC ..................................................... H10D 84/86
See application file for complete search history.

(56) References Cited

U.S. PATENT DOCUMENTS 4,514,649 A 4/1985 Nuzillat et al.
4,612,560 A * 9/1986 Dortu .................. H10D 64/411
257/280

(Continued)

FOREIGN PATENT DOCUMENTS

JP H02046737 A 2/1990
JP 2002324813 A 11/2002
JP 2012094746 A 5/2012

OTHER PUBLICATIONS

PCT International Preliminary Report on Patentability for International Application No. PCT/EP2021/075056 filed on Sep. 13, 2021; Date of Mailing: Mar. 30, 2023; 10 pgs.

(Continued)

*Primary Examiner* — Kretelia Graham
*Assistant Examiner* — Adin Hrnjic
(74) *Attorney, Agent, or Firm* — Alix, Yale & Ristas, LLP

(57) ABSTRACT

A Normally-off MESFET device comprising a semiconductor layer, a source contact, a drain contact and a stacked gate contact, wherein the stacked gate contact comprises a bottom metal layer, a top metal layer and an insulating layer between the bottom and top metal layers, wherein the source, drain and stacked gate contacts are in contact with the semiconductor layer, wherein the bottom metal layer and the semiconductor layer form a Schottky contact, creating a depletion region in the semiconductor layer below the bottom metal layer, and wherein the extension of the depletion region into the semiconductor layer is configured to be modulated by application of a voltage to the top metal layer.

13 Claims, 5 Drawing Sheets

(51) Int. Cl.

| | |
|---|---|
| ***H10D 30/47*** | (2025.01) |
| ***H10D 62/85*** | (2025.01) |
| ***H10D 64/01*** | (2025.01) |
| ***H10D 64/64*** | (2025.01) |
| ***H10D 84/86*** | (2025.01) |

(52) U.S. Cl.
CPC ......... *H10D 30/6738* (2025.01); *H10D 62/85* (2025.01); *H10D 62/8503* (2025.01); *H10D 64/0124* (2026.01); *H10D 64/64* (2025.01); *H10D 84/86* (2025.01)

(56) References Cited

U.S. PATENT DOCUMENTS

| | | | | |
|---|---|---|---|---|
| 5,274,255 | A | 12/1993 | de la Houssaye | |
| 6,630,382 | B1 * | 10/2003 | Thornton | H10D 84/86 257/E27.068 |
| 2004/0142535 | A1 * | 7/2004 | Chung | H10D 1/696 438/396 |
| 2008/0106926 | A1 * | 5/2008 | Brubaker | H10B 63/30 257/E21.665 |
| 2009/0206363 | A1 * | 8/2009 | Machida | H10D 30/4755 257/133 |
| 2011/0220978 | A1 * | 9/2011 | Ikeda | H10D 30/475 257/77 |
| 2014/0264239 | A1 * | 9/2014 | Ananthan | G11C 13/0002 257/4 |
| 2019/0020311 | A1 * | 1/2019 | Kang | H03D 7/1466 |

OTHER PUBLICATIONS

Extended European Search Report for Application No. 20196868.2-1212 filed Sep. 18, 2020; Dated: Mar. 15, 2021; 3 pgs.

Ching-Sung Lee et al, "Comparative studies on AlGaN/GaN/Si MOSHFETs with AlO/TiO stacked dielectrics by using an ultrasonic spray pyrolysis deposition technique", Apr. 5, 2017 [Apr. 5, 2017], vol. 32, No. 5, p. 55012, XP020315755, DOI: 10.1088/1361-6641/AA6374, ISSN: 0268-1242, [retreived on Apr. 5, 2017], Section 1. Introduction; figure 1, 7 pgs.

PCT International Search Report and Written Opinion for International Application No. PCT/EP2021/075056 filed on Sep. 13, 2021, Date of Mailing: Nov. 23, 2021, 7 pgs.

* cited by examiner

NORMALLY-OFF MESFET DEVICE WITH STACKED GATE CONTACT

BACKGROUND

The invention relates to a normally-off metal semiconductor field effect transistor (MESFET) device comprising a semiconductor layer, a source contact, a drain contact and a stacked gate contact, to a method of manufacturing a normally-off MESFET device and to an electrical circuit, comprising a first and a second normally-off MESFET device.

As electronic applications are increasingly used in all kinds of technical fields, the demand for highly efficient electronic devices is growing. Typically, such devices are based on semiconductor materials, so there is a great need for high-efficiency semiconductor devices in particular. Increasing breakdown strength of the devices and decreasing energy losses within use become critical. Reducing energy losses allows for larger integration and less power consumption in the case of digital circuits, and higher voltage and current handling in case of power devices and circuits.

SUMMARY

Against the background of the aforementioned problems, it is therefore an object of the present invention to provide an improved MESFET.

The solution according to the invention lies in the features of the independent claims. Advantageous further embodiments are subject of the dependent claims.

According to the invention a normally-off MESFET device comprising a semiconductor layer, a source contact, a drain contact and a stacked gate contact is disclosed, wherein the stacked gate contact comprises a bottom metal layer, a top metal layer and an insulating layer between the bottom and top metal layers, wherein the source, drain and stacked gate contacts are in contact with the semiconductor layer, wherein the bottom metal layer and the semiconductor layer form a Schottky contact, creating a depletion region in the semiconductor layer below the bottom metal layer, and wherein the extension of the depletion region into the semiconductor layer is configured to be modulated by application of a voltage to the top metal layer.

The normally-off MESFET device according to the invention is for example a stacked-gate MESFET or stacked-gate high electron mobility transistor (HEMT).

The invention relates to a particularly advantageous embodiment of a MESFET in which the electrically conductive connection between the metal gate of a MESFET device and its semiconductor layer is separated. This is achieved by replacing the, typically homogeneous, metal gate with a multilayer stacked gate, which comprises two metal layers insulated from each other. The bottom metal layer is designed to form a Schottky contact with the semiconductor layer of the MESFET device, creating a depletion region in the semiconductor layer below the bottom metal layer and allowing for normally-off operation of the MESFET. Being electrically insulated from the bottom metal layer by an insulating layer, the top metal layer affects the bottom metal layer electrostatically. Application of a voltage to the top metal layer induces charges in the bottom metal layer, leading to a modulating of the depletion region. When a forward voltage is applied to the top metal layer, the depletion region is modulated such that it shrinks due to the charges induced in the bottom metal layer, and as a result, a current begins to flow from the source contact to the drain contact. Both positive and negative voltages can be applied to the top metal layer to either increase or decrease the size of the depletion region. This can be done without the fear of forward biasing the Schottky contact by driving the gate through the top metal contact, because the insulating layer between the bottom and top metal layers prevents electrical current from flowing from the top metal layer into the semiconductor layer.

The invention has identified that this particular separation of the electrically conductive bottom and top metal layers in a stacked gate contact allows the gate leakage current to be decisively reduced, and can be combined with the feature of normally-off operation of a MESFET device. The claimed solution enables energy losses to be reduced, especially during operation, i.e., in on-state, of a normally-off MESFET device. Since it is not necessary for operation of MESFET devices to apply gate voltages above a specific threshold voltage to create a conducting channel, as it is the case for MOSFET devices, their operation can start from zero gate voltage onward. As a result, low voltage and current digital operation is possible. This way, energy losses related to gate operation can be significantly decreased, which allows for digital circuits, e.g., CPUs, with a generally lower energy consumption compared to the MOSFET based counterparts.

In the following, some expressions are explained first:

A "stacked gate" refers to a layout of a gate of a transistor, which comprises a plurality of layers, vertically stacked on top of each other. "Vertically" means perpendicular to the direction of the transistor channel, i.e., perpendicular to the direction of the current flow of the transistor between source and drain contacts.

A "normally-off" device (also known as an "enhancement-mode" device) in the technical field of field-effect transistors (FETs) describes a transistor type that is in OFF state at zero gate-source voltage, or, when considering amplifying or digital circuits, at zero input voltage. In contrast, a "normally-on" device (also known as a "depletion-mode" device) refers to a transistor type that is in ON state at zero gate-source voltage or zero input voltage.

A "Schottky contact" describes a direct electrical contact between a metal and a semiconductor. This contact forms a Schottky barrier, leading to a rectifying behavior of the electrical contact. This happens both when the semiconductor is n-type and its work function is smaller than the work function of the metal, and when the semiconductor is p-type and the opposite relation between work functions holds. The opposite, i.e., a non-rectifying contact, is called an "Ohmic contact".

The semiconductor layer may comprise or may be constituted of elemental semiconductors, such as for example Si and Ge, and/or of compound semiconductors, in particular III-V semiconductor material, such as for example GaAs, GaN or other families of compound semiconductors. The semiconductor layer may also comprise or be constituted of 2D materials, which are able to provide a Schottky contact with metal, such as for example graphene. The semiconductor layer may be formed at least partially out of crystalline material.

The bottom metal layer may comprise one or more metals and/or alloys. It can be comprised of a different sublayers itself, for example such that the contact region of the bottom metal layer with the insulating layer makes an appropriate surface for creation and/or attachment of the insulating layer. The bottom metal layer is to be such that, in conjunction with the semiconductor layer doping, work function and electron affinity, the work function and physical properties of the bottom metal layer result in a depletion region providing normally-off operation of the MESFET device.

For example, in case of the semiconductor layer comprising or being constituted of GaAs or GaN, the bottom metal layer may for example comprise Ni or Ti. Using Ni as bottom metal layer allows for providing a Schottky contact to GaN, while Ti can be used for providing a Schottky contact to GaAs.

The top metal layer may also comprise one or more metals and/or alloys and can also be comprised of a different sublayers itself. For example, the top metal layer may be designed in order to show a particularly low resistance. For example, the top metal layer may comprise Au. Exemplarily, the material of the bottom metal layer is different to the top metal layer.

The insulating layer can be created by allowing the top surface of the bottom metal layer to form an insulating material. For example, by applying a gas inside a vacuum chamber or via chemical processes, e.g., by oxidization. It is likewise possible that the insulating layer is formed via the deposition of an insulating material, e.g., by chemical or physical deposition. It is also possible that the insulating layer comprises different materials and/or different layers, for example an oxide layer and a nitride layer. For example, the insulating layer may comprise at least two sublayers of different materials.

According to an embodiment of the normally-off MESFET device, the semiconductor layer comprises a first semiconductor sublayer and a second semiconductor sublayer.

The first and second semiconductor sublayers may for example have different band gaps and/or exhibit different work functions when in contact with a semiconductor material. By considering individual semiconductor sublayers within the semiconductor layer, the number of design options for normally-off MESFET devices can be increased and/or one or more of their properties can be further improved. This creates greater scope and flexibility in the creation of normally-off MESFET devices.

Exemplarily, the semiconductor layer may form a HEMT structure. Therein, the first semiconductor sublayer may be a substrate layer and the second semiconductor sublayer a barrier layer. The first semiconductor sublayer may further comprise the high electron mobility region.

When being formed as a HEMT structure, the bottom gate metal is applied onto a semiconductor sublayer forming the barrier. The barrier sublayer may also be comprised of a plurality of individual sublayers, e.g., each of which of a different material composition. By designing the semiconductor layer accordingly, the normally-off MESFET device can be combined with the advantages of a HEMT, such as high gain, high switching speeds, low noise values and high thermal operation capability.

The depletion region in the semiconductor layer may for instance be created along the entire thickness of the semiconductor layer.

Accordingly, the depletion region may be created not only in the channel of the transistor between the source and drain contacts, but may also extend further into the semiconductor layer. As a result, leakage currents that occur within the semiconductor layer (e.g., in a substrate layer of the semiconductor layer), for example due to thermal excitation, can be suppressed.

According to an exemplary embodiment, the top metal layer comprises a first area and a second area, wherein the first and second areas are electrically separated from each other, wherein the extension of the depletion region into the semiconductor layer is configured to be modulated by application of a voltage to at least one of the first area and the second area.

This configuration allows for a “dual gate” design of the stacked gate. A first voltage (“blocking voltage”) may be applied to the first area such that a specific extension of the depletion region into the semiconductor layer is set. The stacked gate as a whole is then driven by applying a second voltage to the second area, such that the extension of the depletion region, set by the application of the first voltage, can be modulated, wherein e.g., the second voltage is of the opposite polarity compared to the first voltage. This configuration enables particularly precise control of the transistor and also at especially low currents. Furthermore, the first and second areas can be chosen to be large enough such that their associated capacitances with the bottom metal layer is several times larger than the capacitance between the bottom metal layer and the depletion region in the semiconductor layer. In this manner most of the voltage applied to the top metal layer would be dropped at the Schottky junction, so the device can be operated like within the same voltage range compared to a device with one top metal layer.

Advantageously, the bottom metal layer is arranged to be electrically connected. For example, the bottom metal layer may be electrically connected to the source contact, so that the voltage applied to the top metal layer will influence the voltage level of both bottom metal layer and source contact. This allows to obtain a more inert behavior of the normally-off MESFET device.

Additionally or alternatively, the bottom metal layer may be electrically connected externally. This allows for individually setting a voltage level of the bottom metal layer, so the characteristics of the device can be tuned in a particularly flexible manner.

In another embodiment the normally-off MESFET device, the thickness of the insulating layer is designed to limit leakage current between the bottom metal layer and the top metal layer in on-state to less than 4000 $A/cm^2$, preferably to less than 1000 $A/cm^2$, more preferably to less than 100 $A/cm^2$.

Thus, the thickness of the insulating layer is to be designed as a tradeoff between two opposing aspects. The first aspect is the amount of leakage current to be allowed, and the second is the desire to control the extension of the depletion region as extensively as possible by application of a voltage to the top metal layer. In the sense of the first aspect, the thickness of the insulating layer should be as great as possible, whereas the second aspect requires the smallest possible thickness. Also, the dielectric constant of the material (or the material layers) used within the insulating layer has an impact on the leakage current between the bottom metal layer and the top metal layer in on-state. With a larger dielectric constant the control over the depletion region can be more direct and to a larger extent. Also a material with larger dielectric constant allows for less leakage current for a given thickness. Thus, for a given material of the insulating layer, the thickness of the insulating layer is to be designed depending on the dielectric constant of the material. The higher the dielectric constant, the lower may the thickness be designed in order to achieve the required limits of leakage current values. Exemplary materials of the insulating layer comprise $Si_3N_4$, $Al_2O_3$, $ZrO_2$, $HfO_2$, $La_2O_3$, $Ra_2O_3$ and $TiO_2$. The dielectric constant of these materials increases from $Si_3N_4$ to $TiO_2$ in order of their nomination. $Al_2O_3$, $ZrO_2$, $HfO_2$ and $TiO_2$ allow for a particularly easy and reliable deposition on top of the bottom metal gate. For example, the thickness of an insulating layer comprising at least one of $Al_2O_3$, $ZrO_2$, $HfO_2$ and $TiO_2$ may be 60 nm limiting the leakage current between the bottom metal layer and the top metal layer in on-state to less than 4000 $A/cm^2$, and may be 110 nm limiting the leakage current between the bottom metal layer and the top metal layer in on-state to less than 100 $A/cm^2$.

According to an embodiment the stacked gate contact is configured to have voltages of both polarities applied to the top metal layer.

Therein, the polarity of the voltage may be applied dependent on the type of semiconductor in the semiconductor layer. This allows to use the normally-off MESFET device in numerous scenarios, for example in combining a first normally-off MESFET device with a semiconductor layer comprising a n-type semiconductor with a second normally-off MESFET device with a semiconductor layer comprising a p-type semiconductor in an electrical circuit, e.g., on a common substrate. This way, a high versatility of the normally-off MESFET device can be achieved.

In accordance with the invention, there is also disclosed a method of manufacturing a normally-off MESFET device with a stacked gate contact according the invention, comprising: providing a semiconductor layer, applying a source contact and a drain contact onto the semiconductor layer, applying a bottom metal layer onto the semiconductor layer, wherein the bottom metal layer and the semiconductor layer form a Schottky contact, creating a depletion region in the semiconductor layer below the bottom metal layer, applying an insulating layer onto the bottom metal layer, applying a top metal layer onto the insulating layer, wherein the extension of the depletion region into the semiconductor layer is configured to be modulated by application of a voltage to the top metal layer, wherein preferably the insulating layer and the top metal layer are applied in-situ.

An in-situ application of different layers is to be understood as deposition of one layer after another without the possibility for contamination of the contact area of the layers, for example without breaking of the vacuum in one process environment (e.g., deposition of layers within one vacuum chamber without venting).

In an embodiment of the method, a transistor area is defined as the area spanned between the source contact and the drain contact, wherein the step of applying a bottom metal layer comprises extending the bottom metal layer to a stacked gate area different from the transistor area, and wherein the insulating layer is applied onto the bottom metal layer in the stacked gate area.

After deposition of the bottom metal gate layer, the device may for example be removed from the deposition system. Metal connections to the bottom metal gate layer are provided in a specific stacked gate area different from the transistor area. The insulating layer is then formed onto those parts of the bottom metal layer that are situated in the stacked gate area. The top metal layer is deposited on top of the insulating layer in the stacked gate area. By this, the top metal layer can be placed outside of the transistor area, which facilitates the contacting of this layer and thus of the gate.

Furthermore, an electrical circuit according to the invention is disclosed, comprising a first normally-off MESFET device according to the invention, wherein the semiconductor layer comprises a n-type semiconductor, and a second normally-off MESFET device according to the invention, wherein the semiconductor layer comprises an p-type semiconductor.

Such an electrical circuit may for instance be built on a common substrate.

In an embodiment of the electrical circuit, the drain contact of the first normally-off MESFET device is electrically connected to the source contact of second normally-off MESFET device, wherein the top metal layers of the first and the second normally-off MESFET devices are electrically connected, wherein the extension of the depletion region into the semiconductor layer in the first and the second normally-off MESFET devices is configured to be modulated by application of a voltage to one of the top metal layers.

This configuration allows for provision of a digital NOT gate, which can also be used as an inverter amplifier, in which the leakage current between top metal layer and the semiconductor layer in the first and second normally-off MESFET device is significantly reduced. The described electrical circuit can also be used in any amplifying circuit such as input or output of operational amplifiers, current mirrors, current sinks or sources.

It is to be understood that the presentation of the invention in this section is merely by way of examples and non-limiting.

BRIEF DESCRIPTION OF THE DRAWINGS

The invention is explained in more detail below by way of examples in conjunction with the accompanying drawings, showing advantageous embodiments.

In the figures show.

DETAILED DESCRIPTION

Figure 1:
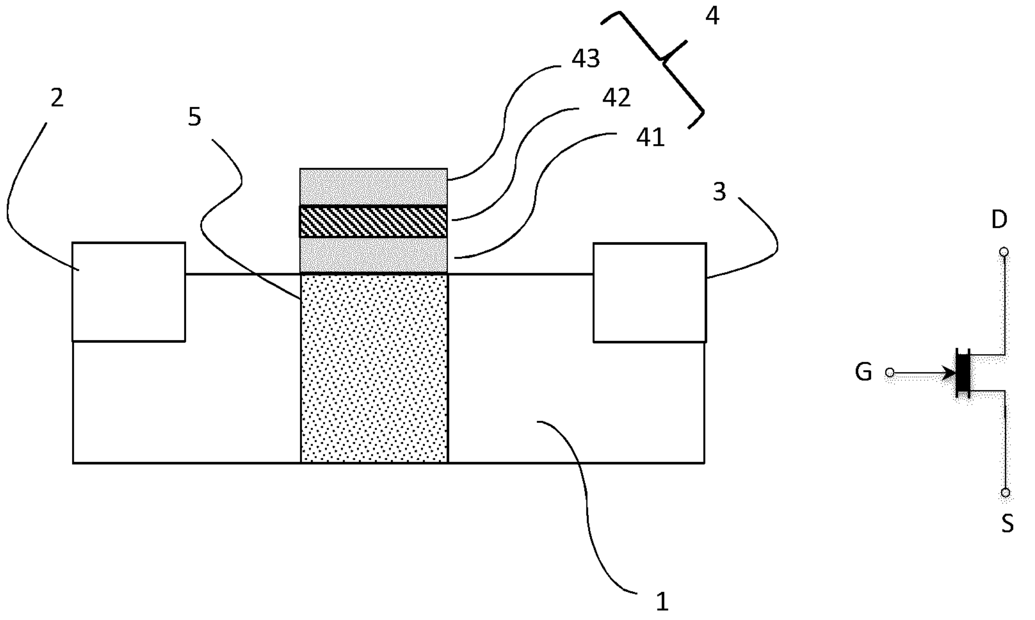
FIG. 1 a schematic representation of a first embodiment of a normally-off MESFET device according to the invention.
Figure 2:
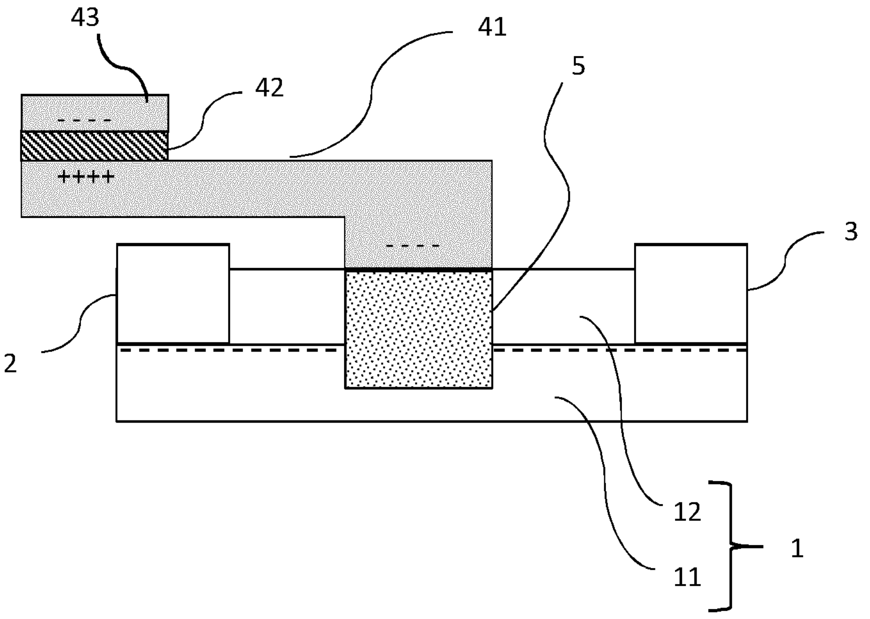
FIG. 2 a schematic representation of a second embodiment of a normally-off MESFET device according to the invention.
Figure 3:
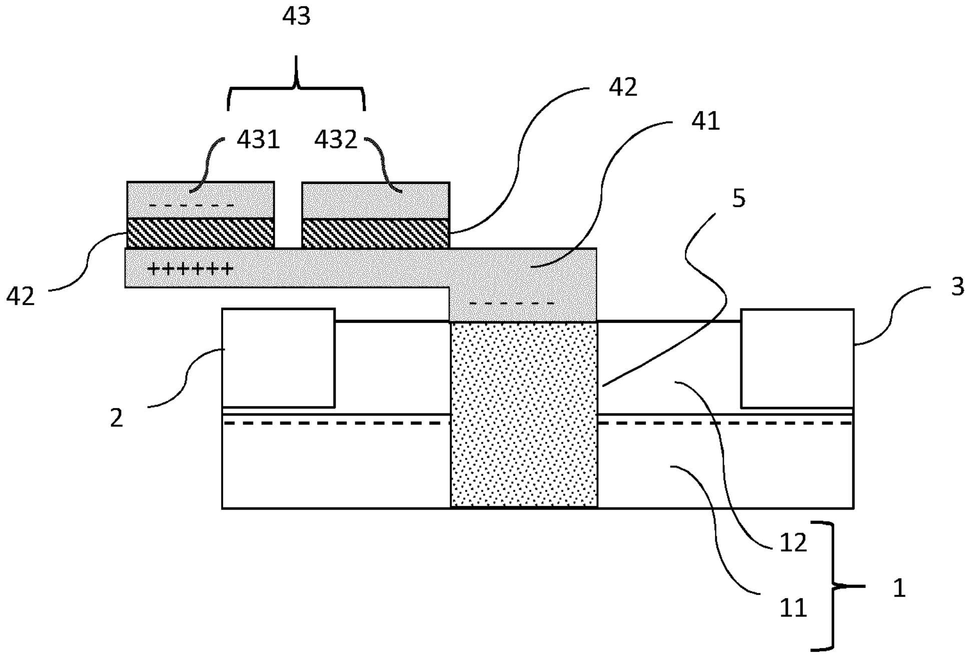
FIG. 3 a schematic representation of a third embodiment of a normally-off MESFET device according to the invention.

Each of FIGS. 1, 2 and 3 shows a normally-off MESFET device according to the invention, which comprises a semiconductor layer 1, a source contact 2, a drain contact 3 and a stacked gate contact 4.

The stacked gate contact 4 comprises a bottom metal layer 41, a top metal layer 43 and an insulating layer 42. The insulating layer 42 is situated between the bottom metal layer 41 and top metal layer 43. Accordingly, the stacked gate contact 4 has a sandwich structure, in which the insulating layer 42 lies between the bottom and top metal layers 41 and 43. In such a stacked gate contact 4, application of negative voltage to the top metal layer 43 results in the creation of positive charges in the contact region of the bottom metal layer 41 with the insulating layer 42 and negative charges in the contact region of the bottom metal layer 41 with the semiconductor layer 1. Accordingly, application of positive voltage to the top metal layer 43 leads to the creation of positive charges in the contact region of the bottom layer 41 with the semiconductor layer 1. Due to the insulating layer 42, there will however no leakage current be flowing between the top metal layer 43 and the bottom metal layer 41.

The normally-off MESFET device may be embodied on a substrate (not shown), wherein the semiconductor layer 1 is placed on top of the substrate. The semiconductor sublayer 1 may for example be an elemental semiconductor, such as Si, which comprises appropriate doped regions for acting as a transistor.

Each of the source contact 2, the drain contact 3 and the stacked gate contact 4 is in contact with the semiconductor layer 1. The bottom metal layer 41 and the semiconductor layer 1 form a Schottky contact, creating a depletion region 5 in the semiconductor layer 1 below the bottom metal layer 41. In the example presented in FIG. 1, the depletion region 5 is created in the semiconductor layer 1 along the entire thickness of the semiconductor layer 1.

In the device, electrical current may pass from the source contact 2 to the drain contact 3 through the semiconductor layer 1, depending on the respective voltage levels applied to the source, stacked gate and drain contacts.

The extension of the depletion region 5 into the semiconductor layer 1 can be modulated by application of a voltage to the top metal layer 43. For example, if the device is n-channel, i.e., the semiconductor layer 1 is an n-type semiconductor, a reverse bias voltage applied to the top metal layer 43 induces negative charges in the bottom metal layer 41, wherein this negative charge is compensated by positive charges in the region of the semiconductor layer 1 below the bottom metal layer 41, forming the depletion region 5. The same effect can be achieved in the case of the device being p-channel by applying a forward bias voltage, which leads to inducing negative charges in the depletion region 5.

On the right hand side of FIG. 1, the electronic symbol for an n-channel normally-off MESFET device is provided. The gate being constituted by the stacked gate contact 4 is represented by two separated lines. A p-channel device would have its gate arrow pointing in the opposite direction.

FIG. 2 shows a second embodiment, in which the bottom metal layer 41 extends to a stacked gate area different from the transistor area, which is defined as the area spanned between the source contact 2 and the drain contact 3. The insulating layer 42 is applied onto the bottom metal layer 41 in this stacked gate area, and the top metal layer 43 is applied onto the insulating layer 42 likewise. Again, the insulating layer 42 prevents leakage current from flowing between the top metal layer 43 and the bottom metal layer 41.

As an example, charges induced in the bottom metal layer 41 by application of a negative voltage to the top metal layer 43 are indicated by minus signs (representing negative charges) and plus signs (representing positive charges). By applying a positive voltage to the top metal layer 43, charges of opposite sign compared to the ones illustrated in FIG. 2 are induced.

In the example of FIG. 2, the semiconductor layer 1 comprises a first semiconductor sublayer 11 and the second semiconductor sublayer 12. In the presented exemplary embodiment, the normally-off MESFET device is a GaN-based HEMT, wherein the first semiconductor sublayer 11 is a GaN substrate layer and the second semiconductor sublayer 12 is a barrier layer composed of AlGaN. This HEMT structure leads to the formation of a two-dimensional electron gas (2DEG) in the contact region of the substrate layer 11 with a barrier layer 12, which is indicated as dashed line in FIG. 2.

In this device, electrical current may pass from the source contact 2 to the drain contact 3 via the 2DEG, if the depletion region 5 does not extend to such a depths of the semiconductor layer 1, that the 2DEG would be interrupted. This may be achieved by an according modulation of the depletion region 5 by applying a (positive) voltage to the top metal layer 43.

The device of FIG. 3 is similar to the one of FIG. 2, with the difference that the top metal layer 43 comprises a first area 431 and a second area 432, which areas are electrically separated from each other. The extension of the depletion region 5 into the semiconductor layer 1 can be modulated by applying a voltage to one of the first area 431 and second area 432.

Such a configuration allows for inducing charges in the bottom metal layer 41 by voltage biasing the first area 431 such that the depletion region 5 will not only be created to an extent that normally-off operation of the MESFET device is achieved, but along the entire thickness of the semiconductor layer 1, i.e., the depletion region 5 will also extend along the entire thickness of the substrate layer 11. This way, leakage currents that may occur within the substrate layer, for example due to thermal excitation, are suppressed.

The second area 432 can then be used as an input for voltage biasing the bottom metal layer 41 to modulate the extension of the depletion region 5, i.e., to reduce the extension of the depletion region 5 caused by the voltage biasing applied to the first area 431. The configuration of FIG. 3 allows for a very precise setting even of very low output currents of the MESFET device.

Figure 4:
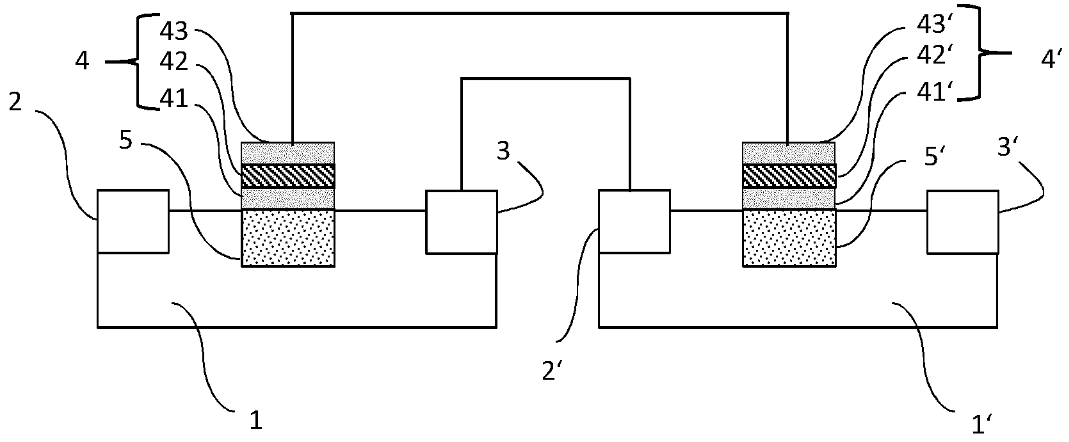
FIG. 4 a schematic representation of an embodiment of an electric circuit according to the invention.

An embodiment of an electrical circuit according to the invention is presented in FIG. 4. It shows two normally-off MESFET devices as described above, each comprising a semiconductor layer 1, 1', a source contact 2, 2', a drain contact 3, 3', a stacked gate contact 4, 4' and a depletion region 5, 5'. Each of the stacked gate contacts 4, 4' comprises a bottom metal layer 41, 41' and a top metal layer 43, 43' with an insulating layer 42, 42' situated between the bottom metal layer 41, 41' and the top metal layer 43, 43'.

The difference between the two devices is that the semiconductor layer 1 of the first device is of n-type, while the semiconductor layer 1' of the second device is of p-type.

The drain contact 3 of the first normally-off MESFET device is electrically connected to the source contact 2' of the second normally-off MESFET device. Furthermore, the top metal layers of the stacked gate contact 4, 4' are electrically connected, as well.

This configuration allows for provision of a digital NOT gate, which can also be used as an inverter amplifier. Because the input terminal is attached to top metal layer 43, 43' of the stacked gate contacts 4, 4', which is isolated from the respective bottom metal layer 41, 41' and the semiconductor 1, 1', the leakage current between top metal layer 43, 43' and the semiconductor layer 1, 1' is significantly reduced. Furthermore, the input can take both polarities of voltage without the fear of forward biasing the Schottky contact between the bottom metal layer 41, 41' and the semiconductor layer 1, 1'. The exemplary electrical circuit can also be used in any amplifying circuit such as input or output of operational amplifiers, current mirrors, current sinks or sources.

Figure 5:
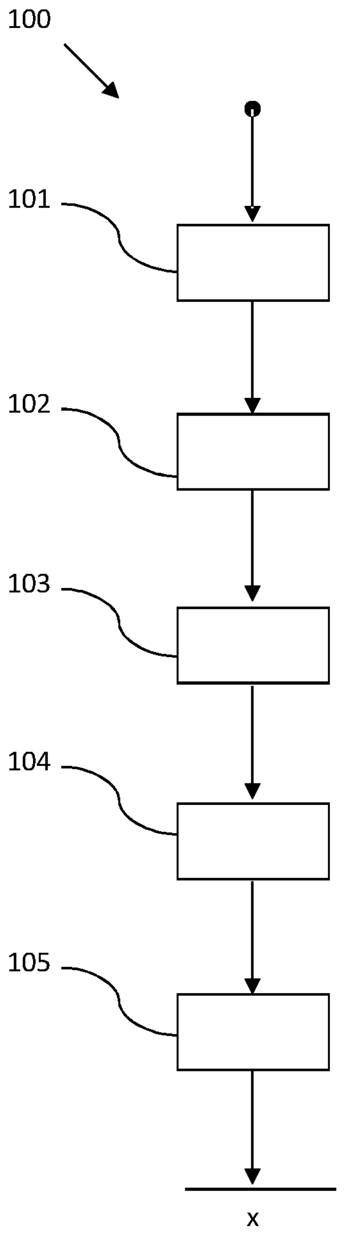
FIG. 5 a schematic flow diagram of an embodiment of a method according to the invention.

FIG. 5 shows a flow diagram of an embodiment of a method 100 according to the invention for manufacturing a normally-off MESFET device with a stacked gate contact.

In a method step 101 a semiconductor layer 1 is provided, for example a semiconductor layer, which forms a HEMT structure.

In step 102, a source contact 2 and a drain contact 3 are applied onto the semiconductor layer 1. This may be done for instance by metal deposition in an evaporation process and/or by sputtering.

A bottom metal layer 41 is applied onto the semiconductor layer 1 in step 103, which may be performed analog to the application of the metallic source and drain contacts 2 and 3. The bottom metal layer 41 is applied such that it forms a Schottky contact with the semiconductor layer 1, onto which it is deposited. This leads to the creation of a depletion region 5 in the semiconductor layer 1 below the bottom metal layer 41.

Method step 104 comprises applying an insulating layer 42 onto the bottom metal layer 41. Depending on the material of the insulating layer 42 this may be performed for instance by Plasma Enhanced Chemical Vapor Deposition (PECVD) for example in the case of nitrides, or Atomic Layer Deposition (ALD) for example in the case of oxides such as $HfO_2$. Also, a chemical treatment of the deposited bottom metal layer 41, such as Plasma Oxidation, is possible in order to achieve the application of the insulating layer 42, for example in the case of $TiO_2$.

In step 105 a top metal layer 43 is applied onto the insulating layer 42, which allows to modulate the extension of the depletion region 5 into the semiconductor layer 1 by application of a voltage to the top metal layer 43. Similar to the bottom metal layer 41 and the source and drain contacts 2 and 3, deposition of the top metal layer 43 may be exemplarily done in an evaporation process and/or by sputtering. If the insulating layer 42 and the top metal layer 43 are to be applied in-situ, an appropriate processing means has to be chosen in order to being able to deposit the insulating (non-conducting) layer 42 as well as the (conducting) top metal layer 43. For example, this can be achieved in an ALD system.

The embodiments of the invention described in this specification and the optional features and characteristics indicated in each case with respect thereto shall also be understood as disclosed in all combinations with each other. In particular, the description of a feature encompassed by an embodiment—unless explicitly stated to the contrary—shall also not be understood herein as meaning that the feature is indispensable or essential for the embodiment.

The invention claimed is:

1. A normally-off MESFET device comprising:

a semiconductor layer (1);

a source contact (2) and a drain contact (3) in contact with the semiconductor layer (1) defining a transistor area between the source contact (2) and the drain contact (3); and a stacked gate contact (4) comprising a bottom metal layer (41) in contact with the semiconductor layer (1) in the transistor area and extending to a stacked gate area different from the transistor area, an insulating layer (42) on the bottom metal layer (41) in the stacked gate area, and a top metal layer (43) on the insulating layer, wherein the bottom metal layer (41) and the semiconductor layer (1) form a Schottky contact, creating a depletion region (5) in the semiconductor layer (1) below the bottom metal layer (41), an extension of the depletion region (5) into the semiconductor layer (1) is modulated by application of a voltage to the top metal layer (43).

2. The normally-off MESFET device of claim 1, wherein the semiconductor layer (1) comprises a first semiconductor sublayer (11) and a second semiconductor sublayer (12).

3. The normally-off MESFET device of claim 1, wherein the semiconductor layer (1) comprises a III-V semiconductor material.

4. The normally-off MESFET device of claim 3, wherein the semiconductor layer (1) forms a HEMT structure, wherein a first semiconductor sublayer (11) is a substrate layer and a second semiconductor sublayer (12) is a barrier layer, and wherein the first semiconductor sublayer (12) comprises a high electron mobility region.

5. The normally-off MESFET device of claim 1, wherein the depletion region (5) in the semiconductor layer (1) is created along an entire thickness of the semiconductor layer (1).

6. The normally-off MESFET device of claim 1, wherein the insulating layer (42) comprises at least two sublayers of different materials.

7. The normally-off MESFET device of claim 1, wherein the top metal layer (43) comprises a first area (431) and a second area (432), wherein the first and second areas are electrically separated from each other, and wherein the extension of the depletion region (5) into the semiconductor layer (1) is configured to be modulated by application of a voltage to at least one of the first area (431) and the second area (432).

8. The normally-off MESFET device of claim 1, wherein the bottom metal layer (41) is arranged to be electrically connected externally.

9. The normally-off MESFET device of claim 1, wherein the stacked gate contact (4) is configured to have voltages of both polarities applied to the top metal layer (43).

10. A method (100) of manufacturing a normally-off MESFET device with a stacked gate contact (4), said method comprising:

providing (101) a semiconductor layer (1);

applying (102) a source contact (2) and a drain contact (3) onto the semiconductor layer (1) defining a transistor area between the source contact (2) and the drain contact (3);

applying (103) a bottom metal layer (41) onto the semiconductor layer (1), wherein the bottom metal layer (41) and the semiconductor layer (1) form a Schottky contact, creating a depletion region (5) in the semiconductor layer (1) below the bottom metal layer (41), said step of applying the bottom metal layer (41) comprising extending the bottom metal layer (41) to a stacked gate area different from the transistor area;

applying (104) an insulating layer (42) onto the bottom metal layer (41) in the stacked gate area; and applying (105) a top metal layer (43) onto the insulating layer (42), wherein the extension of the depletion region (5) into the semiconductor layer (1) is configured to be modulated by application of a voltage to the top metal layer (43), wherein the insulating layer (42) and the top metal layer (43) are applied in-situ.

11. An electrical circuit, comprising:

a first normally-off MESFET device of claim 1, wherein the semiconductor layer (1) comprises an n-type semiconductor; and a second normally-off MESFET device of claim 1, wherein the semiconductor layer (1') comprises a p-type semiconductor.

12. The electrical circuit of claim 11, wherein the drain contact (3) of the first normally-off MESFET device is electrically connected to the source contact (2') of the second normally-off MESFET device, wherein the top metal layer (43) of the first normally-off MESFET device and the top metal layer (43') of the second normally-off MESFET device are electrically connected, and wherein the extension of the depletion region (5, 5') into the semiconductor layer (1, 1') in the first normally-off MESFET device and in the second normally-off MESFET devices is configured to be modulated by application of a voltage to one of the top metal layers (43, 43').

13. The normally-off MESFET device of claim 1, wherein a thickness of the insulating layer (42) limits leakage current between the bottom metal layer (41) and the top metal layer (43) in an on-state to less than 100 A/$cm^2$.

* * * * *